United States Patent
Sirimamilla et al.

(10) Patent No.: US 10,043,610 B2
(45) Date of Patent: Aug. 7, 2018

(54) IMPOSING A ROTATIONAL FORCE DURING A DROP OF AN ELECTRONIC DEVICE TO REDUCE BREAKAGE

(71) Applicant: MOTOROLA MOBILITY LLC, Chicago, IL (US)

(72) Inventors: Pavana Abhiram Sirimamilla, Chicago, IL (US); Martin R. Pais, North Barrington, IL (US); Maninder S. Sehmbey, Hoffman Estates, IL (US)

(73) Assignee: Motorola Mobility LLC, Chicago, IL (US)

( * ) Notice: Subject to any disclaimer, the term of this patent is extended or adjusted under 35 U.S.C. 154(b) by 404 days.

(21) Appl. No.: 14/830,118

(22) Filed: Aug. 19, 2015

(65) Prior Publication Data

US 2016/0379743 A1   Dec. 29, 2016

Related U.S. Application Data

(60) Provisional application No. 62/185,791, filed on Jun. 29, 2015.

(51) Int. Cl.
| | | |
|---|---|---|
| *G06F 19/00* | (2018.01) | |
| *H01F 7/20* | (2006.01) | |
| *H05K 1/18* | (2006.01) | |
| *H04B 1/3888* | (2015.01) | |

(52) U.S. Cl.
CPC ............. *H01F 7/20* (2013.01); *H04B 1/3888* (2013.01); *H05K 1/18* (2013.01)

(58) Field of Classification Search
CPC .......................... B65H 2511/11; G06F 3/0321
USPC ................. 702/141, 117, 118, 182–185, 150
See application file for complete search history.

(56) References Cited

U.S. PATENT DOCUMENTS

2013/0257582 A1*  10/2013  Rothkopf .............. G06F 1/1656
                                                                340/3.1

OTHER PUBLICATIONS

Wikipedia, "Falling cat problem", https://en.wikipedia.org/wiki/Falling_cat_problem, downloaded from the Internet: Aug. 19, 2015, all pages.

* cited by examiner

*Primary Examiner* — Edward Raymond
(74) *Attorney, Agent, or Firm* — Yudell Isidore PLLC

(57) ABSTRACT

An apparatus detects a free-fall state of an electronic device, determines an orientation of the electronic device with reference to gravity when the free-fall state is detected, and predicts that the electronic device will strike a surface within a critical angle range. The prediction is based on the detection of the free-fall state and on the orientation of the electronic device. An electromagnetic torque is generated within the electronic device that re-orients the electronic device outside the critical angle. The apparatus comprises a processing system, a free-fall sensor coupled to the processing system, an orientation sensor coupled to the processing system, a magnetic-field generator, and a first coil that is electrically coupled to the processing system.

20 Claims, 7 Drawing Sheets

700

705

DETERMINE A DIRECTION OF MOTION OF THE ELECTRONIC DEVICE WITH REFERENCE TO GRAVITY WHEN THE FREE FALL STATE IS DETECTED

DETERMINE A DISTANCE TO THE SURFACE WHEN THE FREE FALL STATE IS DETECTED

ANALYZE AT LEAST ONE OF A VISUAL IMAGE AND A SONAR SIGNAL.

DETERMINE A SURFACE TYPE BY ANALYSIS BASED ON AT LEAST ONE VISUAL IMAGE AND SONAR SIGNAL

IMPOSING A ROTATIONAL FORCE DURING A DROP OF AN ELECTRONIC DEVICE TO REDUCE BREAKAGE

TECHNICAL FIELD

The present invention relates generally to electronic devices and more specifically to generating internal forces to re-orient electronic devices during a drop.

BACKGROUND

Many electronic devices that are portable or personal user devices are subject to being inadvertently dropped. Accordingly, consideration is normally given during the design of portable and personal electronic devices to reducing the likelihood of breakage, but they may be susceptible to damage when the orientation of the portable electronic device is within known angle ranges with reference to the surface that is struck, especially when the surface is very rigid.

BRIEF DESCRIPTION OF THE SEVERAL VIEWS OF THE DRAWINGS

While the appended claims set forth the features of the present techniques with particularity, these techniques, together with their objects and advantages, may be best understood from the following detailed description taken in conjunction with the accompanying drawings of which:

FIG. 7 is a flowchart that shows an optional additional step of the method described with reference to FIG. 6;

FIG. 8 is a flowchart that shows an optional additional step of the method described with reference to FIG. 6;

FIG. 9 is a flowchart that shows a step that describes two techniques that may be used to accomplish the step described with reference to FIG. 8;

FIG. 10 is a flowchart that shows a step that describes two techniques that may be used to accomplish a step described with reference to FIG. 6.

DETAILED DESCRIPTION

Figure 1:
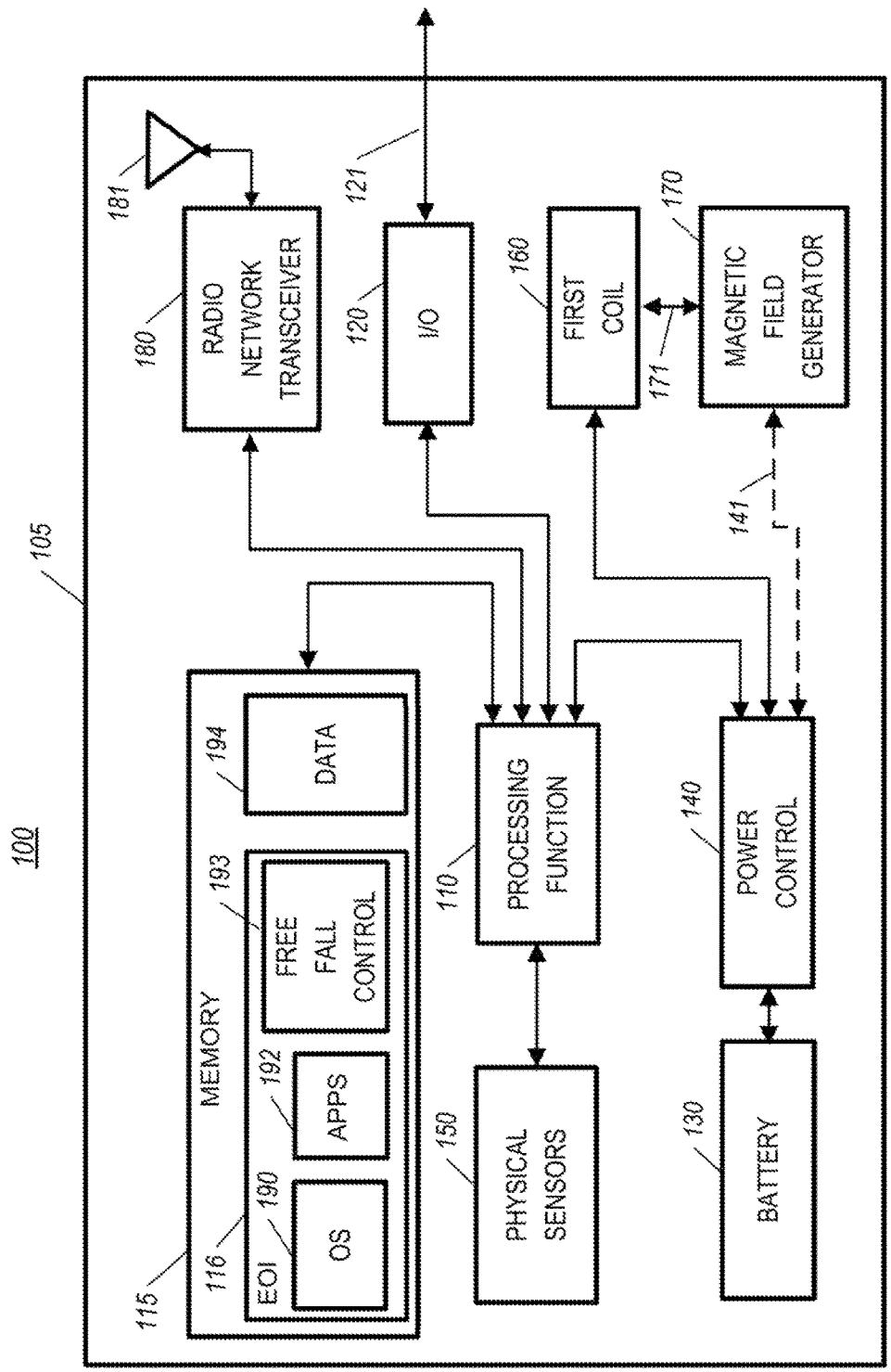
FIG. 1 is a functional block diagram that shows an exemplary electronic device.

Turning to the drawings, wherein like reference numerals refer to like elements, techniques of the present disclosure are illustrated as being implemented in a suitable environment. The following description is based on embodiments of the claims and should not be taken as limiting the claims with regard to alternative embodiments that are not explicitly described herein.

Embodiments described herein generally relate to reducing or eliminating breakage when an electronic device is dropped. Generally speaking, the electronic device is re-oriented so that it is not within a critical angle range with reference to a surface that the electronic device strikes after the electronic device is dropped. This is accomplished by generating one or more impulse rotational torques within the electronic device to nudge and thus to re-orient the electronic device outside of the critical angle range in a stepwise measured way.

Referring to FIG. 1, a functional block diagram 100 shows an electronic device 105, in accordance with certain embodiments. The electronic device 105 includes a processing function 110, a memory 115, input/output ("I/O") interface circuitry 120, a battery 130, a power-control function 140, one or more physical sensors 150, a first coil 160, a magnetic-field generator 170, and may include a radio-network transceiver 180, and an antenna 181. The processing function 110 comprises one or more processing devices (not shown in FIG. 1), each of which may include such sub-functions as central processing units, cache memory, instruction decoders, just to name a few. The processing function 110 executes program instructions which may be located within memory in the processing devices, or may be located in a memory 115 external to the processing function 110, to which the memory 115 is bi-directionally coupled, or in a combination of both. The processing function 110 may, in some embodiments, be further coupled to a radio wide-area network receive/transmit function (also referred to as the radio-network transceiver) 180 that is coupled to a radio antenna 181, which may be internal or external to the electronic device 105. The radio-network transceiver 180 in some embodiments is a cellular receiver-transmitter, and in some embodiments the electronic device 105 is a cellular telephone. The battery 130 may be a rechargeable battery in many embodiments. The electronic device 105 may further include (not shown in FIG. 1) one or more additional radio transceivers, for example a BlueTooth® transceiver or a WiFi® transceiver, or a second radio-network transceiver. In some embodiments one or more of the radio transceivers themselves comprise one or more processors and memory and may also comprise circuits that are unique to radio protocols defined by an industry standard. Some embodiments may have no radio transceivers, such as a personal electronic device that only plays music. Some embodiments may have a WiFi® transceiver but no cellular transceiver, such as some devices commonly referred to as pads or tablets. Other examples of the electronic device 105 include smart watches and fitness monitors.

The functional block diagram 100 shows the executable operating instructions ("EOI") 116 being stored in the memory 115, external to the processing function 110, but as noted above, the memory 115 may be within or shared with the one or more processing devices. The memory 115 also stores data 194. The EOI 116 of the electronic device 105 includes groups of instructions identified as an operating system 190, software applications 192 (including software utilities), and a software application called free-fall control 193. The applications 192 may include conventional human-interface applications and sensor-processing applications that are used for conventional purposes, such as navigation, gesture detection, and positioning of the electronic device 105 with reference to a user's head. The combination of the processing function 110, the EOI 116, and the data 194 may also be referred to as the processing system of the electronic device 105. The processing function 110 may include I/O interface circuitry or may be coupled, as shown in FIG. 1, to separate I/O interface circuitry 120 controlled by the processing function 110. The I/O interface circuitry 120 provides for communications between the processing system and some hardware elements of the electronic device 105, including human-interface components, such as keys and displays, and to wired I/O 121 such as that which uses standard hardware and software protocols (e.g., Universal Serial Bus, FireWire, or Ethernet). The wired input 121 may include a connector for a signal cable that include conductors that provide charging current, or the wired input 121 may include a separate connector for connecting a charging cable to the electronic device 105. The electronic device 105 is powered primarily by a battery 130, which may be coupled to all (with few exceptions) power-consuming circuits and to the power-control function 140. The electronic device 105 may be any electronic device that is susceptible to being dropped.

The first coil 160 and magnetic-field generator 170 are fixedly situated to locally movable structures within the electronic device 105 such that when the magnetic-field generator 170 is generating a magnetic field and a measured burst of current is passed through the first coil 160 a transient electromagnetic torque is generated that imparts an impulse rotational motion the electronic device 105. This interaction is indicated very crudely by the coupling 171. The physics of this interaction and the resulting rotational motion are well known in the art. Because stators provide the magnetic field in many devices known in the art that use a magnetic field and a coil having current flowing through it, the magnetic-field generator 170 may also be called a stator. Similarly, since the first coil 160 has current flowing through to interact with the magnetic field, it may also be called a rotor; in this case, it is mechanically fixed to locally movable structures with reference to the magnetic field. Such embodiments create an impulse torque that induces transient rotational motion of the electronic device 105.

The magnetic-field generator 170 is shown to be optionally coupled to the power-control function 140 by signal 141. In some embodiments, the magnetic-field generator 170 comprises a permanent magnet, such as a neodymium magnet, and includes a coil to generate the magnetic field. In other embodiments, a second coil is used to generate the magnetic field. In this case, the second coil is coupled by signal 141 to the power-control function 140. The second coil may be air wound or have a ferromagnetic or other magnetic core. The first coil 160 is coupled to the power-control function 140. The power-control function 140 is coupled to the battery 130 and to the processing function 110. The processing system, comprising the processing function 110 and the memory 115, can control the power-control function 140 to supply an appropriate amount of current from the battery 130 to the first coil 160 and optionally to the magnetic-field generator 170 (in embodiments when the magnetic-field generator 170 comprises a second coil). The power-control function 140 may be designed to permit a large amount of measured transient current, such as up to 10 Amps, to be drawn from the battery 130 and passed to the first coil 160 and the magnetic-field generator 170. This large amount of current may amount to the short-circuit current that is available from the battery 130 for brief periods of time, such as up to a second.

The physical sensors 150 are coupled to the processing function 110. The physical sensors 150 may comprise one or more of an accelerometer; a magnetometer, a gyroscope, an image sensor, a sonar, a pendulum, a rate gyro, and a global-positioning system, or other physical sensors. In some embodiments, the outputs of the physical sensors 150 may directly provide a free-fall indication or an orientation of the electronic device 105 with reference to gravity. For example, an accelerometer affixed in the electronic device 105 may provide an output that comprises a vector that indicates the acceleration of the electronic device 105. The electronic device 105 may in some embodiments be assumed to be in free fall when the vector has zero magnitude. In some embodiments, the outputs of the physical sensors 150 may require processing to determine a free fall or the orientation of the electronic device 105 with reference to gravity. For example, a determination of orientation with reference to gravity, in order to be sufficiently accurate, may require that inputs from a magnetometer, rate gyros, and a global-positioning system be combined and filtered in known manners. In some embodiments, images or sonar signals in one or more directions may be processed to determine free fall or orientation. The techniques to process image and sonar signals may be more reliable when the orientation of the electronic device 105 is not changing substantially during the free fall, such as during a typical accidental drop from four feet to a floor. The physical sensors 150 used to determine a free-fall condition, and the hardware required (if any) to process the outputs of the physical sensors 150 to determine a free-fall condition is termed herein "a free-fall sensor." The hardware required to process the outputs of the physical sensors 150 to determine the free-fall condition may include the processing function 110, the operating system 190, certain of the applications 192, a portion of the free-fall control application 193, and a portion of the data 194. The physical sensors 150 used to determine the orientation of the electronic device 105 with reference to gravity, and the hardware required (if any) to process the outputs of the physical sensors 150 to determine the orientation of the electronic device 105 with reference to gravity is termed herein "an orientation sensor." The hardware required to process the outputs of the physical sensors 150 to determine the orientation of the electronic device 105 with reference to gravity may include the processing function 110, the operating system 190, certain applications 192, a portion of the free-fall control application 193, and a portion of the data 194.

Figure 2:
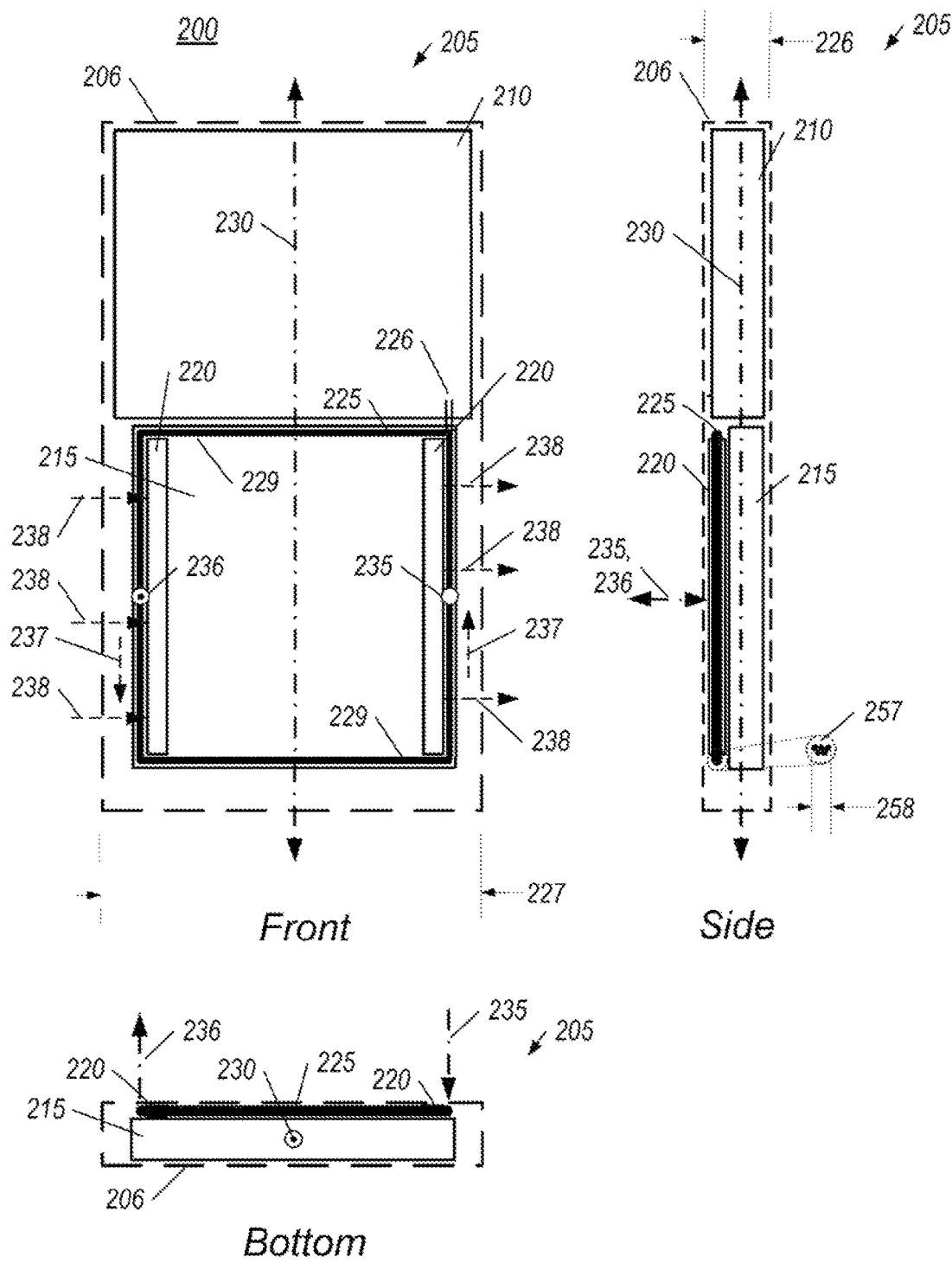
FIG. 2 is a mechanical drawing that shows a front view, side view, and bottom view of an electronic device that can self-rotate during free fall.

Referring to FIG. 2, a mechanical drawing 200 shows a front view, side view, and bottom view of an electronic device 205 that can self-rotate during free fall, in accordance with certain embodiments. A case 206 of the electronic device 205 is illustrated with a dotted line. The electronic device 205 may include some or all the items described with reference to the electronic device 105 in FIG. 1, only some of which are illustrated in FIG. 2 for clarity. An electronics portion 210 of the electronic device 205 may include most of the items described with reference to FIG. 1 except the battery 130, first coil 160, and magnetic-field generator 170. In FIG. 2, a battery 215 is shown, and two magnets 220 are affixed to the battery 215 by, for example, an adhesive. The two magnets 220 form a magnetic-field generator of the electronic device 205 and are analogous to the magnetic-field generator 170 of FIG. 1. A coil 225 is affixed to the battery and edges of the magnets 220. The ends 226 of the coil wire may be part of the contact system of the battery. The coil 225 comprises one wire that has five windings along one edge of each magnet 220 and is analogous to the first coil 160 shown in FIG. 1. An enlarged view 257 of a cross section of the coil 225 shows an arrangement of the five windings. The five windings of the coil 225 have a total width 258. The ends 226 of the wire of the coil 225 are coupled through a connector of the battery 215 to a printed circuit board of the electronic device 205. (The battery connector, which includes the ends 226 and other battery wires that are coupled to spring contacts, is not shown in FIG. 2.) This coupling forms part of the coupling between the first coil 160 and the power-control function 140 shown in FIG. 1. In alternative embodiments, the coil 225 and magnets 220 may be locally movably affixed to the case 206 of the electronic device 205 with the ends 226 of the coil wire soldered to the printed circuit board of the electronic device 205.

The magnets 220 are permanent magnets that have three dimensional, continuous, magnetic fields surrounding them. The direction of the fields at the edges of the magnets 220 to which the coil wires are attached is shown by arrows 238. A longitudinal axis 230 of the electronic device 205 is shown in all the views of FIG. 2. Two forces 235, 236 are shown acting upon the coil wires, and thus upon the electronic device 205. The forces 235, 236 are perpendicular to both the direction of the current and of the magnetic field, as is well known. In the views, the forces 235, 236 are point forces, each of which represents a sum of distributed forces that occur over the portions of coil 225 that are on the surfaces of magnets 220 when current flows through the coil 225 in the direction shown by arrows 237. The point force 235 has a direction into the plane of the drawing of the front of the electronic device 205, while the point force 236 has a direction out of the plane of the drawing of the front of the electronic device 205. Assuming that the mass distribution of the electronic device 205 with reference to the longitudinal axis 230 is symmetrical, then the torques 235, 236 cause the electronic device 205 to rotate about the longitudinal axis 230 when the electronic device 205 is in free fall. The mass distribution of many cellular telephones is approximately symmetrical about the longitudinal axis.

When the electronic device 205 is dropped while having the front surface four feet above and parallel to a horizontal rigid surface (e.g., a solid floor), and having no movement imparted to it before it is dropped, then if the forces 235, 236 are not generated, the electronic device 205 will strike the rigid surface flat on its back in approximately 0.5 seconds with a velocity of approximately 5 meters/second. From experimentation, it is known that many electronic devices have a critical angle range around each orthogonal axis of rotation of the device within which, if the electronic device 205 is oriented when it strikes a rigid surface at the velocity that occurs from a drop from four feet, the electronic device 205 is likely to break. For example, the critical angle range for some cellular telephones may be AO degrees about the longitudinal axis. For these cellular telephones, in drop tests in which the cellular telephones have random rotation about the longitudinal axis 230 when striking a horizontal rigid surface after a four-foot drop, the probability of breakage for certain models may be greater than 85% when the orientation is inside the critical angle range, while the probability of breakage may less than 15% when the orientation is outside the critical angle range. A similar situation may exist for a latitudinal axis.

Figure 3:
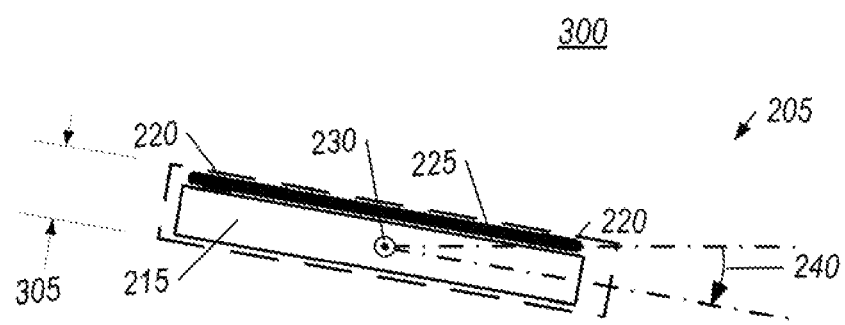
FIG. 3 is a mechanical drawing that shows another bottom view of the electronic device described with reference to FIG. 2.

Refer to FIG. 3, a mechanical drawing that shows another bottom view 300 of the electronic device 205 of FIG. 2. In one example of certain embodiments, a cellular telephone is dropped with an initial angle about the longitudinal axis 230 of zero degrees. When the electronic device 205 is dropped from a height of four feet above a horizontal rigid surface, the electronic device 205 can be rotated in the first direction as shown, by at least 10 degrees about the longitudinal axis 230. This rotation is accomplished by applying a series of measured bursts of current of 10 amps through the coil 225 in the direction shown in FIG. 2 during the drop. The electronic device 205 could alternatively be rotated by at least 10 degrees in a second direction about the longitudinal axis 230 by applying another series of measured bursts of current of 10 amps through the coil 225 during the drop in a direction that is opposite that shown in FIG. 2. In one example, the electronic device 205 is a cellular telephone modeled with a thickness 305 of 8 mm, a width 227 (FIG. 2) of 70 mm, and a mass of 180 gm. Using standard physics equations for this example, it can be shown that a total force of no more than $10^{-5}$ Newtons is needed at the extremities of the width 227 of the electronic device 205 to rotate the electronic device 205 through an angle of 10 degrees about the longitudinal axis 230 in the approximately 0.5 seconds between the time it is dropped to a floor, starting with no angular motion. It can be further shown that to achieve this using 10 Amperes of current through 5 windings of coil 225 that comprise wires that are each 60 mm along the edges of the magnets 220 requires a magnetic flux density of less than 10 Gauss. Using a coil having 5 windings of 24 American Wire Gauge magnet wire, the five windings could have a total width 228 of about 1.5 mm. Neodymium magnets having a surface flux density that is of the order of 1.2 Tesla. Thus, a designer has substantial freedom to modify magnet choices, current magnitudes, quantity of loops, wire size, and exact placement of the magnets within the electronic device 205, while still achieving the needed rotation within the 0.5 sec drop time for this exemplary cellular telephone. Furthermore, the design choices can be readily scaled to achieve similar results for many personal and portable electronic devices. Although the modeling done above assumes a symmetry of mass distribution about the longitudinal, it is well known that small differences in the symmetry will result in small reductions of the angle of rotation about the longitudinal axis that is calculated and may induce small rotations in other axis and small displacements of the center of mass of the electronic device. Experimentation can be done to determine the amount of current needed to achieve a particular minimum rotation about the longitudinal axis. The presence of a display in the electronic device 205 will typically minimize non-symmetry of the mass about the longitudinal axis. The magnets 220 may be alternatively provided in some embodiments by a single magnet that spans the width of the electronic device 205. In this case, latitudinal portions of the coil 225 (portions 229, FIG. 2) may be arranged to be away from the surfaces of such a single magnet, so that no substantial forces are produced around rotational axes that are orthogonal to the longitudinal axis of rotation 230 when current is sent through coil 225.

Figure 4:
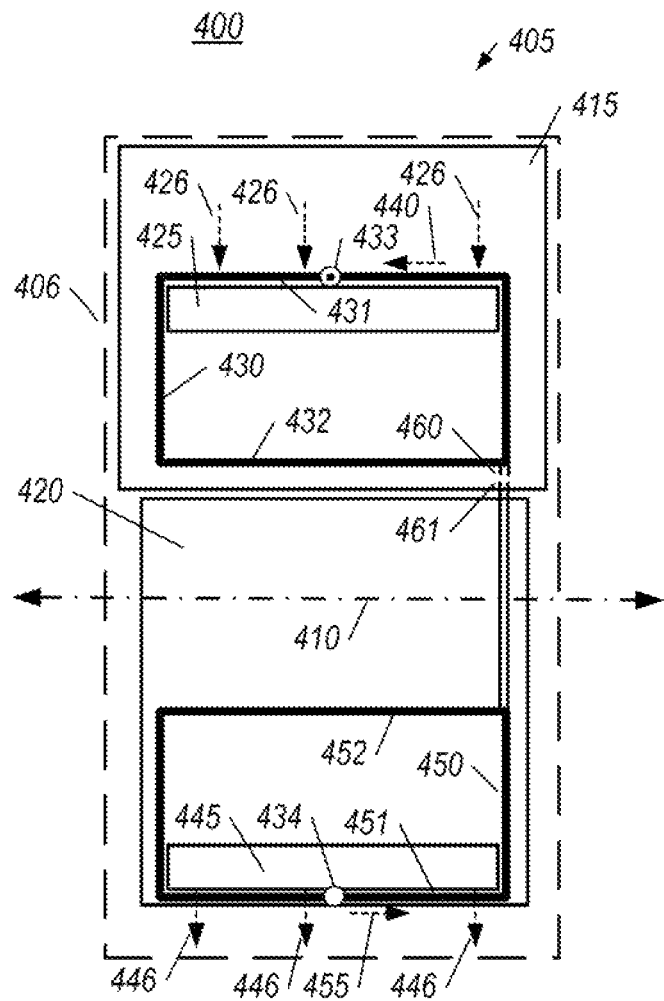
FIG. 4 is a mechanical drawing that shows a front view of an electronic device that can self-rotate during free fall.

Referring to FIG. 4, a mechanical drawing shows a front view 400 of an electronic device 405 that can self-rotate during free fall, in accordance with certain embodiments. The electronic device 405 is the same as electronic device 205 described with reference to FIG. 2, except for magnets, coils, and the power-control function 140 of the coils that are described herein with reference to FIG. 1. In these embodiments of the electronic device 405, a latitudinal axis of rotation 410 of the electronic device 405 is shown. The location of the latitudinal axis of rotation 410 below a geometric center of the electronic device 405 is due to a smaller mass in an electronics portion 415 of the electronic device 405 than in the portion that includes a battery 420. Magnets 425 and 445 are locally movably affixed in the electronic device 405 equidistant from the latitudinal axis of rotation 410. Magnet 425 is locally movably affixed to a surface in the portion 415 of the electronic device 405. The direction of the magnetic field along one edge of the magnet 425 is shown by arrows 426. A coil 430 is associated with the magnet 425. A portion 431 of the coil 430 is locally movably affixed to an edge of the magnet 425, such as by an elastomeric adhesive. The coil 430 may have five windings, although there is, as for the embodiments described with reference to FIGS. 2 and 3, considerable latitude in the choice of windings, wire size, maximum current, and magnet properties. When current flows through the portion 431 of coil 430 in the direction shown by arrow 440, a distributed electromagnetic force is induced along the portion 431 of the coil. This distributed force is shown as a single equivalent force 433, having a direction out of the plane of the drawing. The remainder of the coil 430 is locally movably affixed to surfaces of the electronic device 405 within the portion 415, such as a surface of a case 406. Within the remainder of the coil 430 is a portion 432 that is parallel to the portion 431. Portion 432 of the coil 430 is positioned as far from the portion 431 of the coil 430 as practical, so as to reduce electromagnetic forces on the portion 432 as much as possible inasmuch as they may act in opposition to force 433. Alternatively, the magnet 425 and the portion 431 of the coil 430 can be surrounded by an appropriately shaped ferromagnetic material (a magnetic shield) that substantially surrounds the magnet 425 and portion 431 of the coil 430 to contain most of the magnetic field of the magnet 425. Then portion 432 of the coil 430 may be positioned close to the magnet 425, outside of the magnetic shield.

Magnet 445 is locally movably affixed to a surface in the portion of the electronic device 405 that includes the battery 420. The direction of the magnetic field along one edge of the magnet 445 is shown by arrows 446. A coil 450 is associated with the magnet 445. A portion 451 of the coil 450 is locally movably affixed to an edge of the magnet 445, such as by an elastomeric adhesive. When current flows through the portion 451 of coil 450 in the direction shown by arrow 455, a distributed electromagnetic force is induced along the portion 451 of the coil. This distributed force is shown as a single equivalent force 434, having a direction into the plane of the drawing. The remainder of the coil 450 is affixed to locally movable surfaces of the electronic device 405 within the portion including the battery 420, such as a surface of the battery or the case 406. Within the remainder of the coil 450 is a portion 452 that is parallel to the portion 451. Portion 452 of the coil 450 is positioned at the same distance with reference to portion 451 of the coil 450 as portion 432 of coil 430 is positioned from portion 431 of coil 430. Windings of the coils 430, 450 are coupled 460, 461 to one or more printed circuit boards of the electronic device 405 and are thereby further coupled to a power-control function such as power-control function 140 described with reference to FIG. 1. In the embodiments shown in FIG. 4, when equivalent currents are induced in the coils 430, 450 in directions shown by arrows 440, 455, approximately equal and opposite distributed forces are induced on the coil windings 430, 450 that are represented by forces 433, 434. A magnetic shield may also be used for the magnet 445 and portion 451 of coil 450 allowing portion 452 of coil 450 to be positioned close to the magnetic shield.

Figure 5:
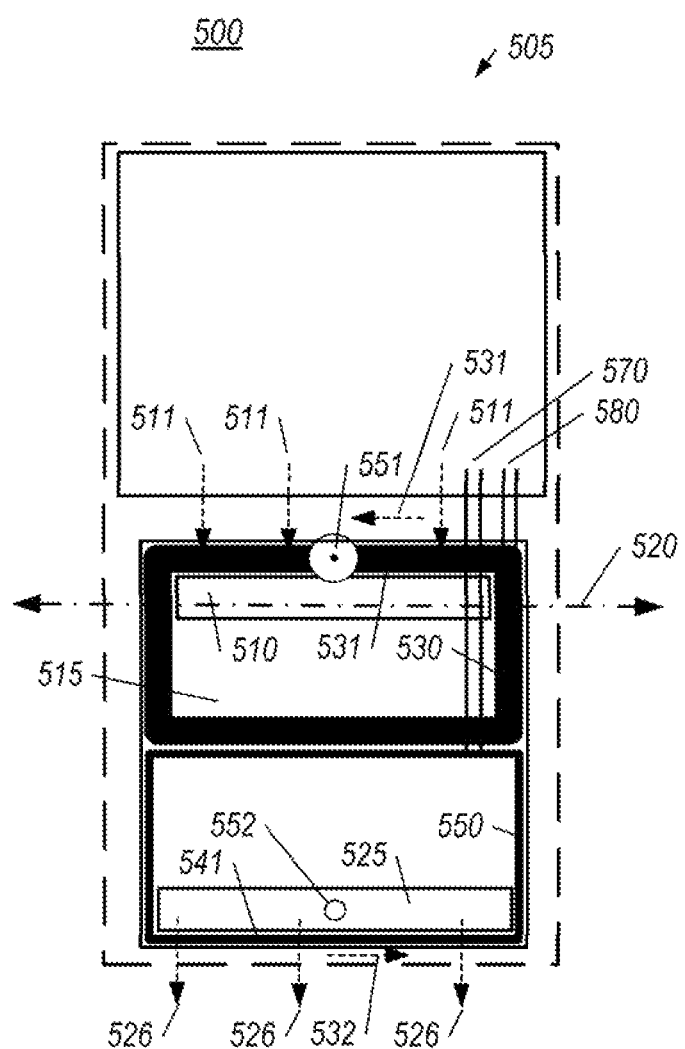
FIG. 5 is a mechanical drawing that shows a front view of an electronic device that can self-rotate during free fall.

Referring to FIG. 5, a mechanical drawing shows a front view 500 of an electronic device 505 that can self-rotate during free fall, in accordance with certain embodiments. The electronic device 505 is the same as electronic device 205 described with reference to FIG. 2, except for magnets, coils, and control functions of the magnets and coils that are described herein. In these embodiments, a magnet 510 is locally movably affixed to the electronic device 505 and is closer to a latitudinal axis of rotation 520 than another magnet 525. A coil 530 is associated with magnet 510, and another coil 550 is associated with magnet 525. A portion 531 of coil 530 is locally movably affixed to an edge of magnet 510, and a portion 541 of coil 550 is locally movably affixed to an edge of magnet 525. The remaining portions of the coils 530, 550 are locally movably affixed to the case of the electronic device 505. Magnetic fields at the edges of magnets 510, 525 are shown with respective arrows 511, 526. Rotational motion can be induced by a transient impulse local displacement movement by producing a sufficiently stronger force on the winding of the magnet 510 that is closer to the axis of rotation 520. This is indicated by a large force 551 and a smaller force 552. Producing the forces 551, 552 can be accomplished by providing appropriately scaled currents or quantity of windings in the two coils 530, 550. The currents are controlled to flow in directions shown by arrows 531, 532 when the forces 551, 552 are to be generated in the directions shown in FIG. 5. FIG. 5 is drawn to show more windings in coil 530 than in 550. Ends 570, 580 of the windings of the coils 530, 550 are coupled to electronics of the electronic device 505 and may be coupled to a power-control function such as power-control function 140 described with reference to FIG. 1. In some embodiments, the magnets 510, 525 and coils 530, 550 may be affixed to the battery 515 and the ends of the windings 570, 580 of the coils 530, 550 may be coupled to the connector of the battery 515, wherefrom they are further coupled to a power-control function such as power-control function 140 described with reference to FIG. 1.

It will be further appreciated that impulse rotational motion may be also provided in an axis of rotation that passes through the thickness of the electronic device 205. This is less practical in electronic devices 205 such as cellular telephones and tablets, for which the thickness dimension may be an order of magnitude less than the width and height but would be beneficial in electronic devices that are nearer to a cube shape.

Figure 6:
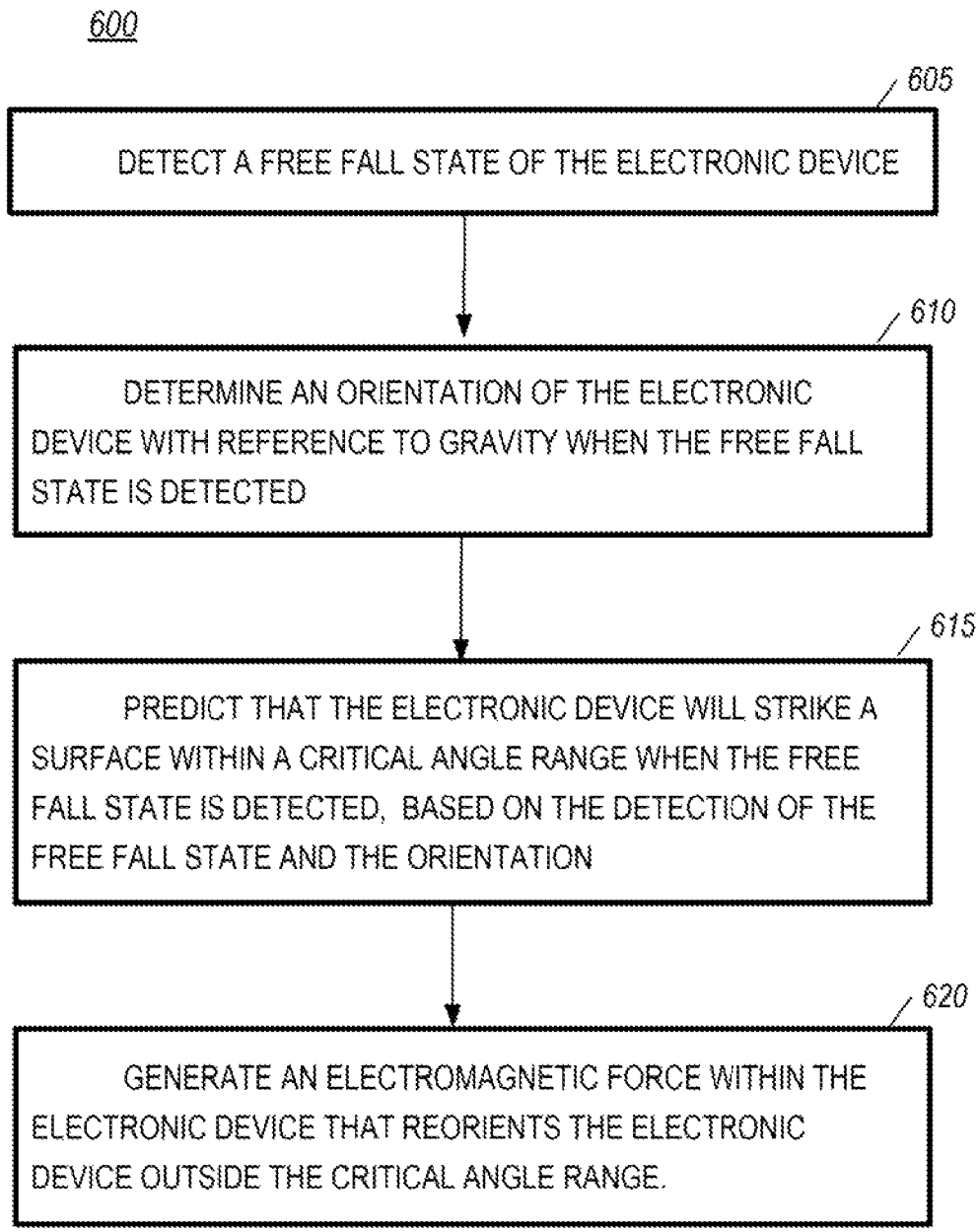
FIG. 6 is a flowchart that shows some steps of a method for electronic-device operation.

Referring to FIG. 6, a flowchart 600 shows some steps of a method for electronic-device operation, in accordance with certain embodiments. To accomplish an objective of reducing the probability of breakage of an electronic device 205 when it is dropped, the electronic device 205 accomplishes certain actions. At step 605, a free-fall state of the electronic device 205 is detected. This may be accomplished by analyzing the outputs of one or more sensors that may be included in the electronic device 205. For example, detection of the free-fall state may be accomplished by using an accelerometer, for example by tracking the direction of a constant acceleration of 1.0 gravity by using filtering, as is known in the art, and determining an abrupt change to no acceleration in the direction of gravity. The determination may be made less processor intensive (and therefore quicker) by using information from outputs of one or a combination of two or more sensors. Thus, the free-fall state may be detected by analyzing the outputs of at least one of an accelerometer, a magnetometer, a gyroscope, a sonar, a pendulum, or a global-positioning system, as is known in the art or described herein. For some electronic devices 205, an image sensor may operate in conjunction with a calculated orientation of the electronic device 205 to track objects that are perpendicular to the ground, which could be used for free-fall detection. The image sensor may comprise a plurality of angles of view in order to provide the tracking of vertical objects. Certain combinations of the sensors may provide a quicker and more accurate determination than just one, and the combinations used may depend on what is available in a particular electronic device 205. There may be a known delay in detecting the free-fall state.

At step 610, an orientation of the electronic device 205 is determined with reference to gravity when the free-fall state is detected. This orientation is determined for the time at which the free-fall state is calculated to have started, in response to the detection of free fall in step 605. The orientation can be established directly after the free fall is detected or may be under constant determination such that it is available when a free fall is detected. As noted above, the orientation can be determined from the outputs of an accelerometer with appropriate filtering. In general, the orientation may be determined from outputs of at least one of an accelerometer, a pendulum, a gyroscope, an image sensor, a sonar, or a global-positioning system, as is known in the art or described herein. Certain combinations of the sensors may provide a quicker and more accurate determination than just one, and the combinations used may depend on what is available in a particular electronic device 205. In some embodiments in which only the critical angle range for only one axis of rotation is being determined, only the component of orientation in that axis may be needed. In other embodiments, two or three components of the orientation may be used.

At step 615 a prediction is made that the electronic device 205 will strike a surface with an orientation that is within a critical angle range characterized by limits. In some embodiments in which the critical angle range for only one axis of rotation is being determined, a prediction for only that axis may be needed. In other embodiments, predictions for two or three critical angle ranges may be needed for two or three axes of rotation. In many instances, the surface is a floor, and the floor is a rigid surface.

In some embodiments, the predication is made based on the detection of the free-fall state and the orientation of the electronic device 205 with reference to gravity, and assumptions that the electronic device 205 is four feet above a floor and has no rotational or displacement motion at the time the electronic device 205 is dropped. These assumptions about the distance of the drop and the initial motion may be adequate to accomplish a substantial reduction of the probability of breakage of certain electronic devices 205.

At step 620, an electromagnetic force is generated within the electronic device 205 that re-orients the electronic device 205 outside the limits of the critical angle range. In some embodiments, the critical angle range is determined (based on the orientation determined at step 610) in only one axis of rotation of the electronic device 205, as noted above. This method may provide a substantial reduction of the probability of breakage for a certain types of electronic devices 205. For example, experimentation may determine that drops of a particular type of electronic device 205 may happen with initial orientations in one axis of rotation that are more likely to result in the particular electronic device 205 being within the critical angle range for that axis of rotation when the particular electronic device 205 strikes the floor than initial orientations in other axes of rotation. For example, it may be determined from experimentation that a particular cellular telephone is dropped having an orientation that is likely to be relatively parallel to the floor in the longitudinal axis of rotation (and therefore within a critical angle range for the longitudinal axis) and that is outside the critical angle range of the latitudinal axis of rotation. This may happen because the device 205 is held with little left-right tilt but with a significant tilt towards a user's head. In this example, the magnet 220 and coil 225 configuration of FIG. 2 may provide an adequate improvement in the probability of breakage of the electronic device 205 such that a design decision is made to provide that type of cellular telephone with only the one-axis configuration shown in FIG. 2. In this example, in which a four-foot drop is assumed and no initial motion of the electronic device 205 is determined (either there is a determination made that there is no initial motion or no determination of initial motion is made—based on an assumption that no significant initial motion is present in typical drops), a processing system of the electronic device 205, in response to a determination of the free-fall state and that the orientation is within the critical angle range of the longitudinal axis of rotation, controls current to the coil 225 in one of two directions that generates an electromagnetic torque impulse to rotate the electronic device 205 outside the limits of the critical angle range for the longitudinal axis of rotation within the shortest time.

Referring to FIG. 7, a flowchart 700 shows a step 705 of a method for electronic-device operation, in accordance with certain embodiments. Step 705 is an optional additional step of the method described with reference to FIG. 6. At step 705 a direction of motion of the electronic device 205 is determined when the free-fall state is detected. In some embodiments such as those in which only one axis of rotation is used, only the rotational direction of motion in the axis of rotation need be determined. In some embodiments the rotational direction of motion in two or three axes may be determined. The direction of motion for both rotational and translational motion can be determined from outputs from at least one of an accelerometer, a pendulum, a gyroscope, an image sensor, a sonar, or a global-positioning system, as is known in the art or described herein. Certain combinations of the sensors may provide a quicker and more accurate determination than just one, and the combinations used may depend on what is available in a particular electronic device 205. If the magnitude of one of the rotational and translational directions of motion does not exceed a threshold amount, then the respective motion may be ignored. Otherwise, equations of rotational motion may be used based on the orientation and direction of motion of the electronic device 205 that are determined when the free-fall state is detected to predict at step 615 (FIG. 6) whether the electronic device 205 will have an orientation that is within critical angle ranges of one or more axes of rotation when the electronic device 205 strikes the floor, in a well known manner. If a height above the floor is not or has not been determined, then a fixed value, such as four feet, may be used. Thus, step 615 is enhanced for the embodiments using step 705 to further base the prediction on the direction of motion that is determined when the free-fall state is detected.

Referring to FIG. 8, a flowchart 800 shows a step 805 of a method for electronic-device operation, in accordance with certain embodiments. Step 805 is an optional additional step of the method described with reference to FIG. 6. At step 805, a distance to the surface is determined when the free-fall state is detected. It will be appreciated that determining a distance to the surface can improve the accuracy of predication that the electronic device 205 will strike within a critical angle range when a direction of rotational motion of the electronic device 205 is not zero. Furthermore, the rotational motion may be ignored in some embodiments when the components of rotational motion in the axis or axes being controlled are below a threshold. When the distance to the surface is to be used, the distance is included in the equations of motion to predict whether the electronic device 205 will be within one or more critical angle ranges when it strikes the surface. Step 805 is typically used only when step 705 (FIG. 7) is used.

Referring to FIG. 9, a flowchart 900 shows a step 905 of a method for electronic-device operation, in accordance with certain embodiments. Step 905 describes two techniques that may be used to accomplish step 805 (FIG. 8). At step 905, a distance to the surface is determined based on analyzing one of a visual image and a sonar signal. Using a sonar signal to determine a distance to a surface is well known. A sonar signal can be generated by emitting an appropriate outbound audio signal from a speaker of the electronic device 205 and comparing the outbound audio signal to an audio signal that is generated by a microphone of the electronic device 205 upon reception of a reflection of the outbound audio signal. Such analysis may be improved by using the orientation of the device to generate the outbound signal when a speaker of the electronic device 205 is optimally oriented or to select a speaker when the electronic device 205 has more than one. An image or multiple images may be used to determine a distance to a surface to which the electronic device 205 is dropped, especially in conjunction with the orientation determined in step 610. Analysis of a single image within which an object of known size is identified can determine the distance. Multiple images of the object can improve the accuracy as the electronic device 205 falls.

Referring to FIG. 10, a flowchart 1000 shows a step 1005 of a method for electronic-device operation, in accordance with certain embodiments. Step 1005 describes two techniques that may be used to accomplish step 615 (FIG. 6). At step 1005, a surface type is determined based on analysis of at least one visual image or sonar signal. A visual image may be analyzed for features that indicate whether the surface is smooth or rough by employing a flash output of the electronic device 205 and analyzing for reflection patterns and intensity. Similarly, sonar signals can provide information about the type of surface from which they are reflected. The limits of the critical angle range may then be adjusted in accordance with the type of surface. The analysis can be enhanced by using both a visual image and a sonar signal. A table may provide critical angle range adjustment factors based on the type of surface determined. Thus, the prediction is modified by the modification of the critical angle ranges in response to the analysis of the visual images or sonar signals.

Figure 11:
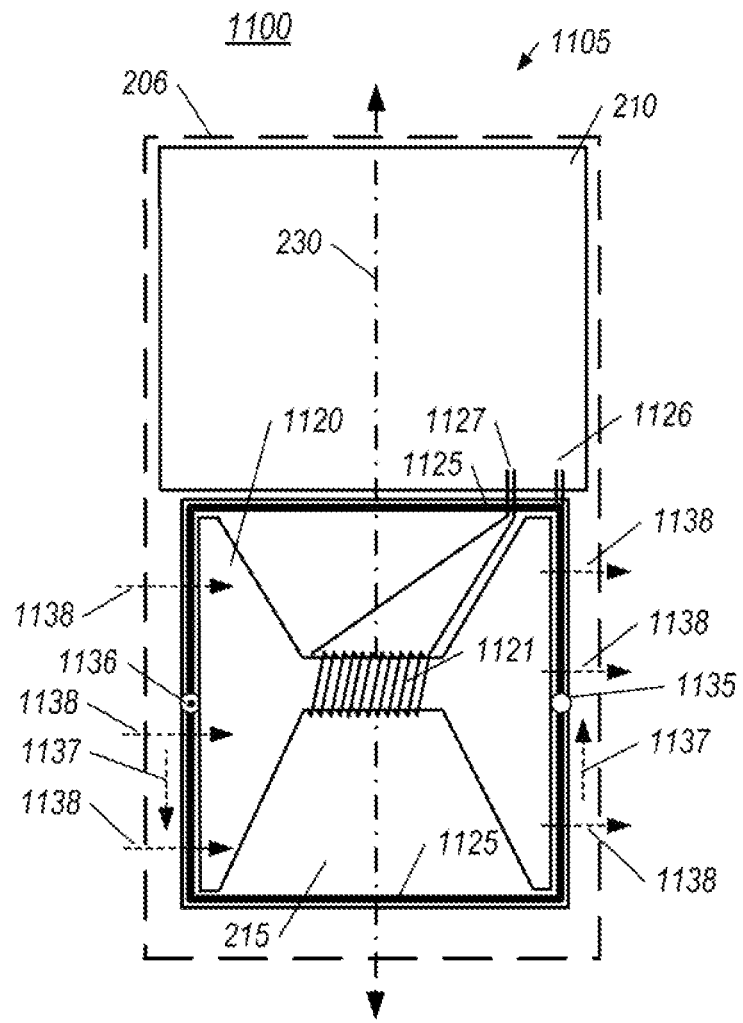
FIG. 11 is a mechanical drawing that shows a front view of an electronic device that can self-rotate.

Referring to FIG. 11, a front view 1100 of an electronic device 1105 that can self-rotate during free fall is shown, in accordance with certain embodiments. The electronic device 1105 is the same as electronic device 205 described with reference to FIG. 2, except for magnets, coils, and control functions of the coils that are described herein. The field-generating apparatus of electronic device 1105 differs from that of the electronic device 205 in that the magnets 220 of electronic device 205 have been replaced by an electromagnet comprising a ferromagnetic core 1120 and solenoid coil 1121. The solenoid coil 1121 induces magnetism in the ferromagnetic core 1120 when current is sent through the solenoid coil 1121, thereby producing a magnetic field similar to the one produced by the magnets 220 (FIG. 2). The direction of this field at the right and left edges of the ferromagnetic core 1120 are shown by arrows 1138. When current is simultaneously sent through coils 1121 and 1125 in the direction shown by arrows 1137, electromagnetic forces 1135, 1136 are produced, causing a rotation of the electronic device 1105 about the longitudinal axis 230 when the electronic device 1105 is in free fall. In some embodiments, the ferromagnetic core 1120, solenoid coil 1121, and coil 1125 are locally movably affixed to the case 206 of the electronic device 1105. The ends 1126, 1127 of the windings of the solenoid coil 1121 and of the coil 1125 are coupled to electronics of the electronic device 1105 and may be coupled to a power-control function such as power-control function 140 described with reference to FIG. 1. In some embodiments, the ferromagnetic core 1120, solenoid coil 1121, and coil 1125 may be affixed to the battery 215, and the ends of the windings 1126, 1127 of the solenoid coil 1121 and of the coil 1125 may be coupled to the connector of the battery 215, wherefrom they are further coupled to a power-control function such as power-control function 140 described with reference to FIG. 1. The ferromagnetic core 1120 is in the form of a flat plate. The material, outline, and thickness of the ferromagnetic core 1120 may be altered to best fit it within the case 206 and to provide an appropriate compromise between maximum magnetic-field strength at the edges of the ferromagnetic core 1120 and the weight and cost of the ferromagnetic core 1120. In some embodiments the ferromagnetic core 1120 may have a cylindrical shape in the portion around which the solenoid coil 1121 is wrapped, such as in electronic devices having a more cubic shape.

Magnetic shields may also be used for the magnets 220, 510, 525 shown in FIGS. 2 and 5, allowing the portions of the respective coils 225, 530, 550 that are not adjacent the magnets 220, 510, 525 to be repositioned to alternative locations and may be used in electronic devices for which self-rotation in more than one axis is to be provided to prevent interference between the fields of two or three axes. Magnetic shields may also be used in the embodiments described with reference to FIG. 2 to change the single coil 225 into two coils wired in parallel, with a coil around each of the pair of magnets 220, having the portions locally movably affixed to the magnet and the magnet within a shield and the remainder of each coil outside each shield.

In view of the many possible embodiments to which the principles of the present discussion may be applied, it should be recognized that the embodiments described herein with respect to the drawing figures are meant to be illustrative only and should not be taken as limiting the scope of the claims. Therefore, the techniques as described herein contemplate all such embodiments as may come within the scope of the following claims and equivalents thereof.

We claim:

1. A method used for electronic device operation, the method comprising:
   detecting a free fall state of the electronic device;
   determining an orientation of the electronic device with reference to gravity when the free fall state is detected;
   predicting that the electronic device will strike a surface within a critical angle range, based on the detection of the free fall state and the orientation of the electronic device; and
   generating, via a magnetic field generator, an electromagnetic force within the electronic device that reorients the electronic device outside the critical angle range.

2. The method according to claim 1, wherein detecting a free fall state of the electronic device comprises analyzing outputs from at least one of an accelerometer; a magnetometer, a gyroscope, an image sensor, a sonar, and a global positioning system.

3. The method according to claim 1, wherein determining the orientation comprises analyzing outputs from at least one of an accelerometer; a magnetometer, a gyroscope, an image sensor, a sonar, a pendulum, and a global positioning system.

4. The method according to claim 1, wherein predicting that the electronic device will strike a surface within a critical angle further comprises determining a direction of motion of the device when the free fall state is detected.

5. The method according to claim 4, wherein predicting that the electronic device will strike a surface within a critical angle range further comprises determining a distance to the surface when the free fall state is detected.

6. The method according to claim 5, wherein determining a distance to the surface further comprises analyzing at least one of a visual image and a sonar signal.

7. The method according to claim 1, wherein predicting that the electronic device will strike a surface within a critical angle range further comprises determining a surface type by analysis based on at least one of a visual image and a sonar signal.

8. The method according to claim 1, wherein generating an electromagnetic force comprises:
  generating a magnetic field; and
  generating an electric current within a solenoid coil, wherein the electric current interacts with the magnetic field to generate the electromagnetic force.

9. An electronic device, comprising:
  a processing system:
  a free fall sensor coupled to the processing system;
  an orientation sensor coupled to the processing system;
  a magnetic field generator; and
  a first coil that is electrically coupled to the processing system;
  wherein the first coil and the magnetic field generator are disposed such that when an electric current is passed through the first coil, the electric current interacts with a magnetic field of the magnetic field generator to generate a rotational force upon the electronic device, and
  wherein executable software instructions in the memory are executed by the processing system to configure the electronic device to:
    detect a free fall state of the electronic device based on outputs of the free fall sensor;
    determine, by the processing system, an orientation of the electronic device with reference to gravity based on outputs of the orientation sensor,
    predict that the electronic device will strike a surface within a critical angle range, and
    generate, via the magnetic field generator, an electromagnetic force upon the electronic device by passing the electric current through the first coil to reorient the electronic device outside the limits of the critical angle range.

10. The electronic device according to claim 9, wherein the free fall sensor comprises at least one of an accelerometer; a magnetometer, a gyroscope, an image sensor, a sonar, and a global positioning system.

11. The electronic device according to claim 9, wherein the orientation sensor comprises at least one of an accelerometer; a magnetometer, a gyroscope, an image sensor, a sonar, a pendulum, and a global positioning system.

12. The electronic device according to claim 9, wherein the magnetic field generator comprises at least one permanent magnet affixed to the electronic device.

13. The electronic device according to claim 12, wherein the at least one permanent magnet comprises a permanent magnetic affixed to a surface of a battery of the electronic device.

14. The electronic device according to claim 9, wherein the magnetic field generator comprises a second coil affixed to the electronic device and coupled to the processing system.

15. The electronic device according to claim 14, wherein the magnetic field generator further comprises a core disposed within the second coil.

16. The electronic device according to claim 9, wherein the electronic device further comprises:
  at least one of a visual sensor coupled to the processing system; and
  a sonar that is coupled to the processing system;
  wherein the prediction that the electronic device will strike a surface within the critical angle range is made based on outputs of at least one of the visual sensor and the sonar.

17. An electronic device, comprising:
  a processing system:
  a free fall sensor coupled to the processing system;
  an orientation sensor coupled to the processing system;
  a stator affixed within the electronic device; and
  a rotor that is affixed within the electronic device and is electrically coupled to the processing system;
  wherein the rotor and the stator are disposed such they generate a rotational force upon the electronic when current is passed through the rotor; and
  wherein executable software instructions in the memory are executed by the processing function for:
    detecting a free fall state of the electronic device based on outputs of the free fall sensor,
    determining an orientation of the electronic device with reference to gravity based on outputs of the orientation sensor;
    predicting that the electronic device will strike a surface within a critical angle range; and
    generating, via the stator, an electromagnetic force within the electronic device that reorients the electronic device outside the first critical angle range.

18. The electronic device according to claim 17, wherein the stator comprises at least one of a magnet or an electromagnet.

19. The electronic device according to claim 17, wherein the rotor comprises at least one coil.

20. A computer program product comprising:
  a tangible computer readable medium; and
  program instructions stored on the tangible computer readable medium that when executed by a processor within an electronic device this is configured with a magnetic field generator, configures the electronic device to perform the functions of:
  detecting a free fall state of the electronic device;
  determining an orientation of the electronic device with reference to gravity when the free fall state is detected;
  predicting that the electronic device will strike a surface within a critical angle range, based on the detection of the free fall state and the orientation of the electronic device; and
  generating, via the magnetic field generator, an electromagnetic force within the electronic device that reorients the electronic device outside the critical angle range.

* * * * *